US012745640B2

(12) United States Patent
Hayashida

(10) Patent No.: US 12,745,640 B2
(45) Date of Patent: Sep. 22, 2026

(54) SEMICONDUCTOR DEVICE, POWER CONVERSION DEVICE AND MOVING BODY

(71) Applicant: Mitsubishi Electric Corporation, Tokyo (JP)

(72) Inventor: Yukimasa Hayashida, Fukuoka (JP)

(73) Assignee: Mitsubishi Electric Corporation, Tokyo (JP)

(*) Notice: Subject to any disclaimer, the term of this patent is extended or adjusted under 35 U.S.C. 154(b) by 409 days.

(21) Appl. No.: 17/608,929

(22) PCT Filed: Aug. 20, 2019

(86) PCT No.: PCT/JP2019/032476
§ 371 (c)(1),
(2) Date: Nov. 4, 2021

(87) PCT Pub. No.: WO2021/033270
PCT Pub. Date: Feb. 25, 2021

(65) Prior Publication Data

US 2022/0238459 A1 Jul. 28, 2022

(51) Int. Cl.
*H10W 42/00* (2026.01)
*B61C 3/00* (2006.01)
(Continued)

(52) U.S. Cl.
CPC ............... *H10W 42/00* (2026.01); *B61C 3/00* (2013.01); *H10W 40/255* (2026.01); (Continued)

(58) Field of Classification Search
None
See application file for complete search history.

(56) References Cited

U.S. PATENT DOCUMENTS 4,673,621 A * 6/1987 Fujiki .................. C09D 133/16 524/544
5,227,502 A * 7/1993 Takago ................ C08G 65/226 549/558
(Continued)

FOREIGN PATENT DOCUMENTS

CN 104620373 A 5/2015
CN 109743882 A 5/2019
(Continued)

OTHER PUBLICATIONS

An Office Action; "Notice of Reasons for Refusal", mailed by the Japanese Patent Office on Jul. 5, 2022, which corresponds to Japanese Patent Application No. 2021-541389 and is related to U.S. Appl. No. 17/608,929; with English language translation.
(Continued)

*Primary Examiner* — Dale E Page
*Assistant Examiner* — Derek L Nielsen
(74) *Attorney, Agent, or Firm* — Studebaker Brackett PLLC

(57) ABSTRACT

Failure analysis and recycle of a semiconductor device are facilitated, and a production efficiency of the semiconductor device is improved. An exterior includes an inner space and an inner surface surrounding the inner space. A semiconductor chip is housed in the inner space and mounted on the inner surface. A first sealing material fills the inner space, is disposed on the inner surface to be overlapped on the semiconductor chip, and is made up of silicone gel. A waterproof water-repellent layer is housed in the inner space, disposed on the inner surface to be overlapped on the semiconductor chip and the first sealing material, and made up of fluorine-series resin or silicone-series resin. A second sealing material fills the inner space, is disposed on the inner surface to be overlapped on the semiconductor chip, the first
(Continued)

sealing material, and the waterproof water-repellent layer, and is made up of silicone gel.

9 Claims, 3 Drawing Sheets

(51) Int. Cl.
*H02P 27/06* (2006.01)
*H10W 40/25* (2026.01)
*H10W 74/10* (2026.01)
*H10W 74/47* (2026.01)
*H10W 76/136* (2026.01)

(52) U.S. Cl.
CPC ....... *H10W 74/127* (2026.01); *H10W 74/476* (2026.01); *H10W 76/136* (2026.01); *H02P 27/06* (2013.01)

(56) References Cited

U.S. PATENT DOCUMENTS 5,275,841 A * 1/1994 Wong .................... H01L 23/296 257/E23.126
5,482,571 A * 1/1996 Yamada ................ H01L 31/056 136/258
8,587,923 B2 * 11/2013 Ogawa ..................... H01G 4/30 361/306.3
2003/0031833 A1 * 2/2003 Sugimura ............... B29C 41/22 428/156
2008/0004424 A1 * 1/2008 Horii ......................... C08F 8/14 528/401
2013/0084517 A1 * 4/2013 Suka ..................... G03F 7/2041 524/378
2014/0138707 A1 * 5/2014 Miki ..................... H10W 74/00 257/77
2015/0187674 A1 * 7/2015 Miyanagi .............. H10W 40/00 257/713
2019/0206751 A1 7/2019 Harada et al.

FOREIGN PATENT DOCUMENTS

JP S58-092739 U 6/1983
JP H07-273247 A 10/1995
JP H08316357 A * 11/1996
JP H10270609 A * 10/1998
JP 2014-150204 A 8/2014
JP 2016-225449 A 12/2016
WO 2014/097798 A1 6/2014

OTHER PUBLICATIONS

International Search Report issued in PCT/JP2019/032476; mailed Oct. 15, 2019.
An Office Action mailed by the State Intellectual Property Office of the People's Republic of China on Oct. 18, 2024, which corresponds to Chinese Patent Application No. 201980099390.3 and is related to U.S. Appl. No. 17/608,929; with English language translation.
An Office Action mailed by China National Intellectual Property Administration on Apr. 16, 2025, which corresponds to Chinese Patent Application No. 201980099390.3 and is related to U.S. Appl. No. 17/608,929; with English language translation.
An Office Action issued by the German Patent and Trademark Office on Aug. 28, 2025, which corresponds to German Patent Application No. 112019007639.6 and is related to U.S. Appl. No. 17/608,929; with English language translation.
Office Action issued in DE 11 2019 007 639.6; mailed by the German Patent and Trade Mark Office on Jan. 27, 2026.
Office Action issued in DE 11 2019 007 639.6; mailed by the German Patent and Trademark Office on Apr. 27, 2026.

* cited by examiner

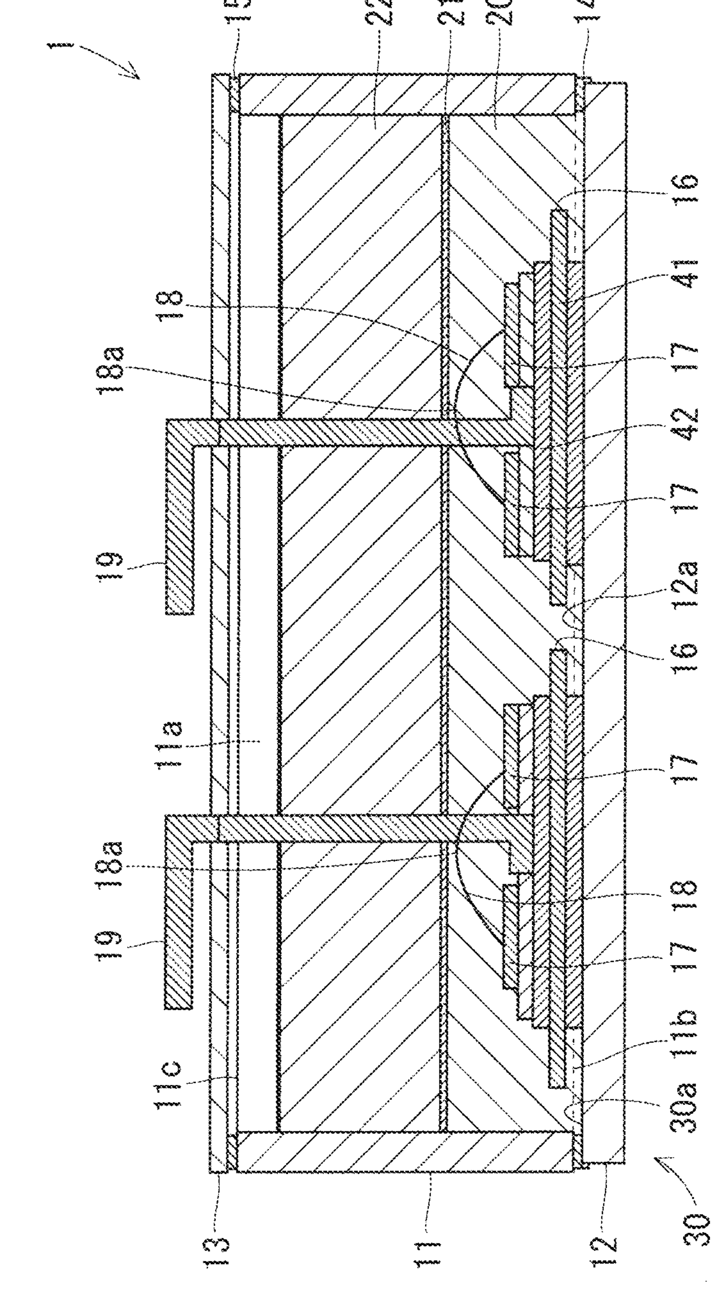
F I G. 1
1
15
22
21
20
14
16
41
18
17
18a
42
17
19
12a
16
11a
17
18a
18
19
17
11b
11c
30a
13
11
12
30

SEMICONDUCTOR DEVICE, POWER CONVERSION DEVICE AND MOVING BODY

TECHNICAL FIELD

The present invention relates to a semiconductor device, a power conversion device, and a moving body.

BACKGROUND ART

A semiconductor device such as a semiconductor module includes a semiconductor chip. The semiconductor device includes a sealing body sealing the semiconductor chip to increase insulation properties and moisture resistance, for example. The sealing body includes a portion made up of epoxy resin in many cases.

For example, in a semiconductor device described in Patent Document 1, a semiconductor element is surrounded by a case. A sealing body is formed in a region surrounded by the case. The sealing body is made up of a first layer, a second layer, and a third layer. Silicon-series resin, for example, is used for the first layer. The second layer is a resin plate made up of a polyphenylene sulfide (PPS) material. Epoxy-series resin, for example, is used for the third layer (Paragraphs 0010-0019).

In a semiconductor device described in Patent Document 2, an area around a chip is sealed by a first layer resin. Next, the whole first layer resin is surrounded using a second layer resin. An upper portion of the second layer resin is sealed by a third layer resin. The first layer resin is resin such as silicone, for example. The second layer resin is resin such as polyimide, for example. The third layer resin is resin such as epoxy, for example (pp. 2, line 16 to pp. 3, line 14).

PRIOR ART DOCUMENTS

Patent Documents

Patent Document 1: Japanese Patent Application Laid-Open No. 2016-225449

Patent Document 2: Japanese Utility Model Application Laid-Open No. 58-92739

SUMMARY

Problem to be Solved by the Invention

However, when the sealing body includes a portion made up of epoxy resin, it is difficult to perform failure analysis of the semiconductor device.

A first reason for difficulty in the failure analysis of the semiconductor device when the sealing body includes the portion made up of the epoxy resin is that the portion made up of the epoxy resin needs to be separated from a remaining portion by adding a thermal history to the semiconductor device when the semiconductor device is disassembled to remove the portion made up of the epoxy resin or the semiconductor device needs to be cut off. The processing of adding the thermal history to the semiconductor device and cutting off the semiconductor device makes identification of a failure point and examination of a trace of damage difficult.

A second reason for difficulty in the failure analysis of the semiconductor device when the sealing body includes the portion made up of the epoxy resin is that when the semiconductor device is in actual use or after the semiconductor device is examined, impurity included in the epoxy resin penetrates elements such as silicone gel and contaminates the elements such as silicone gel, thereby causing a change of color of the elements such as silicone gel. The change of color of the elements such as silicone gel interferes analysis of the semiconductor device, for example.

When the sealing body includes a portion made up of epoxy resin, it is difficult to recycle the semiconductor device by a reason similar to the reason for difficulty in the failure analysis of the semiconductor device.

When the sealing body includes a portion made up of epoxy resin, it needs several hours to put in a fluent material which is the epoxy resin before hardened and harden the fluent material. Thus, a production efficiency of the semiconductor device decreases and a takt time for manufacturing the semiconductor device gets compressed.

In addition to solving these problems, the sealing body also needs to provide a semiconductor device having high insulation properties and having high moisture resistance over a long period of time.

The present invention is made in consideration of these problems. An object of the present invention is to facilitate failure analysis and recycle of the semiconductor device and improve a production efficiency of the semiconductor device. An object of the present invention is to provide a semiconductor device having high insulation properties and having high moisture resistance over a long period of time.

Means to Solve the Problem

The present invention is directed to a semiconductor device.

A semiconductor device includes an exterior, a semiconductor chip, a first sealing material, a waterproof water-repellent layer, and a second sealing material.

The exterior includes an inner space and an inner surface surrounding the inner space.

The semiconductor chip is housed in the inner space and mounted on the inner surface.

The first sealing material fills the inner space, is disposed on the inner surface to be overlapped on the semiconductor chip, and is made up of silicone gel.

The waterproof water-repellent layer is housed in the inner space, disposed on the inner surface to be overlapped on the semiconductor chip and the first sealing material, and made up of fluorine-series resin or silicone-series resin.

The second sealing material fills the inner space, is disposed on the inner surface to be overlapped on the semiconductor chip, the first sealing material, and the waterproof water-repellent layer, and is made up of silicone gel.

The present invention is also directed to a power conversion device including the semiconductor device and a moving body including the power conversion device.

Effects of the Invention

According to the present invention, the semiconductor chip is covered by the silicone gel which can easily fill the inner space or can be easily housed therein, and can be easily removed and the fluorine-series resin or the silicone-series resin. Thus, failure analysis and recycle of the semiconductor device can be facilitated. A production efficiency of the semiconductor device can be improved.

According to the present invention, the semiconductor chip is sealed by the first sealing material and the second sealing material. Thus, the semiconductor device having high insulation properties can be provided. According to the present invention, the waterproof water-repellent layer suppresses exposure of the semiconductor chip to moisture.

Thus, the semiconductor device having high moisture resistance can be provided. According to the present invention, the second sealing material suppresses a foreign material mixed into the waterproof water-repellent layer. Thus, loss of high moisture resistance of the semiconductor device caused by the foreign material mixed into the waterproof water-repellent layer can be suppressed. According to these configurations, the semiconductor device having high insulation properties and having high moisture resistance over a long period of time can be provided.

These and other objects, features, aspects and advantages of the present invention will become more apparent from the following detailed description of the present invention when taken in conjunction with the accompanying drawings.

BRIEF DESCRIPTION OF DRAWINGS

FIG. 1 A cross-sectional view schematically illustrating a semiconductor device according to an embodiment 1.

DESCRIPTION OF EMBODIMENT(S)

1 Embodiment 1

1.1 Structure of Semiconductor Device

Figure 2:
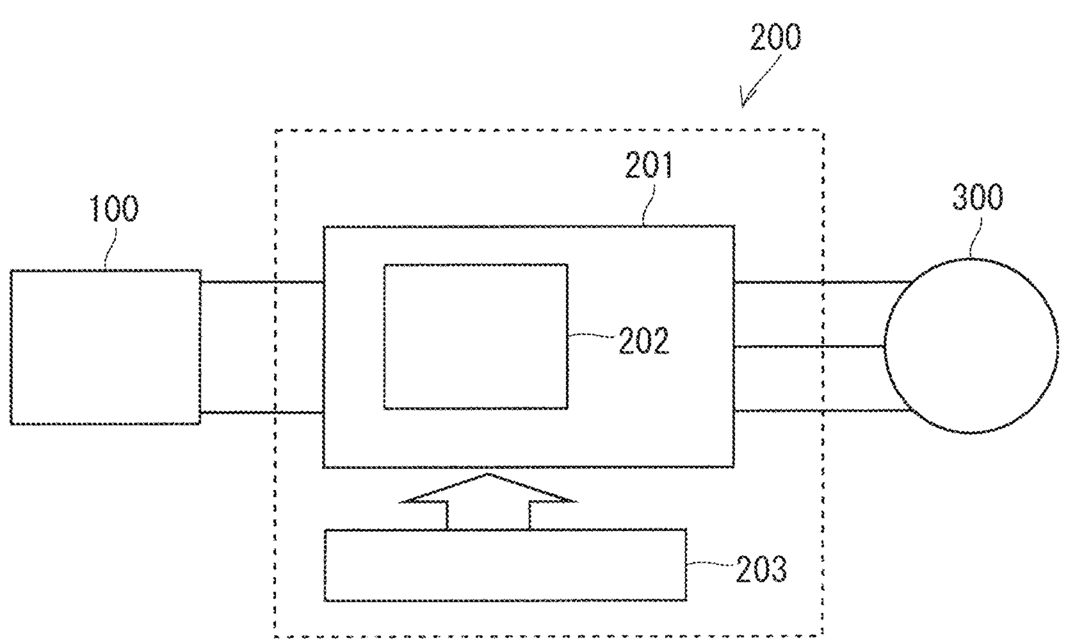
FIG. 2 A block diagram of a power conversion system applying a power conversion device according to an embodiment 2.

FIG. 1 is a cross-sectional view schematically illustrating a semiconductor device according to an embodiment 1.

A semiconductor device 1 according to the embodiment 1 illustrated in FIG. 1 is a semiconductor module including a plurality of semiconductor chips 17. The semiconductor device 1 may be a discrete semiconductor including one semiconductor chip 17.

The semiconductor device 1 includes a chassis 11, a heat radiation plate 12, a cover 13, a silicone adhesive agent 14, a silicone adhesive agent 15, an insulating substrate 16, the semiconductor chip 17, an Al wire 18, an electrode 19, a first sealing material 20, a waterproof water-repellent layer 21, and a second sealing material 22.

The chassis 11, the heat radiation plate 12, the cover 13, the silicone adhesive agent 14, and the silicone adhesive agent 15 constitute an exterior 30. Thus, the semiconductor device 1 includes the exterior 30 including the chassis 11, the heat radiation plate 12, the cover 13, the silicone adhesive agent 14, and the silicone adhesive agent 15.

The chassis 11 includes an inner space 11*a*. The chassis 11 includes a first opening 11*b* and a second opening 11*c*. The inner space 11*a* is exposed to an outer side of the chassis 11 via the first opening 11*b* and the second opening 11*c*.

The heat radiation plate 12 is bonded to the chassis 11 via the silicone adhesive agent 14. The heat radiation plate 12 may be bonded to the chassis 11 via a bonding medium other than the silicone adhesive agent 14. The heat radiation plate 12 may be directly bonded to the chassis 11 without an intervention of a bonding medium. The heat radiation plate 12 covers the first opening 11*b*. The heat radiation plate 12 includes a main surface 12*a* on which the insulating substrate 16 and the semiconductor chip 17 are mounted.

The cover 13 is bonded to the chassis 11 via the silicone adhesive agent 15. The cover 13 may be bonded to the chassis 11 via a bonding medium other than the silicone adhesive agent 15. The cover 13 may be directly bonded to the chassis 11 without an intervention of a bonding medium. The cover 13 covers the second opening 11*c*.

According to these configurations, the semiconductor device 1 includes the exterior 30 including the inner space 11*a* and an inner surface 30*a* surrounding the inner space 11*a*. The main surface 12*a* of the heat radiation plate 12 constitutes a part of the inner surface 30*a* of the exterior 30.

The insulating substrate 16 is housed in the inner space 11*a* of the exterior 30. The insulating substrate 16 is disposed on the main surface 12*a* of the heat radiation plate 12, and bonded to the main surface 12*a* of the heat radiation plate 12. The insulating substrate 16 includes an insulator plate 41 and a conductor pattern 42. The conductor pattern 42 is disposed on the insulator plate 41.

The semiconductor chip 17 is housed in the inner space 11*a* of the exterior 30. The semiconductor chip 17 is disposed on the main surface 12*a* of the heat radiation plate 12, and bonded to an upper surface of the insulating substrate 16. The semiconductor chip 17 is a switching element or a reflux diode, for example. The switching element is a metal oxide semiconductor field effect transistor (MOSFET) or an insulated gate bipolar transistor (IGBT), for example.

The Al wire 18 is housed in the inner space 11*a* of the exterior 30. The Al wire 18 is connected to the semiconductor chip 17. The Al wire 18 is connected to the conductor pattern 42. Accordingly, the Al wire 18 electrically connects the semiconductor chip 17 and the conductor pattern 42 to each other. The Al wire 18 which is a conductor wire made of Al may be replaced with a conductor wire made of a conductor other than Al.

The electrode 19 is bonded to the conductor pattern 42. The electrode 19 passes through the cover 13. Accordingly, a signal can be inputted to the conductor pattern 42 from an outer side of the exterior 30 via the electrode 19. A signal can be outputted from the conductor pattern 42 to the outer side of the exterior 30 via the electrode 19.

The first sealing material 20 fills the inner space 11*a* of the exterior 30. The first sealing material 20 is disposed on the main surface 12*a* of the heat radiation plate 12 to be overlapped on the insulating substrate 16 and the semiconductor chip 17. The first sealing material 20 is made up of silicone gel.

The waterproof water-repellent layer 21 is housed in the inner space 11*a* of the exterior 30. The waterproof water-repellent layer 21 is disposed on the first sealing material 20, and disposed on the main surface 12*a* of the heat radiation plate 12 to be overlapped on the insulating substrate 16, the semiconductor chip 17, and the first sealing material 20. The waterproof water-repellent layer 21 is disposed between the first sealing material 20 and the second sealing material 22. The waterproof water-repellent layer 21 is made up of fluoride-series resin or a silicone-series resin. The waterproof water-repellent layer 21 prevents moisture, which enters the inner space 11*a* of the exterior 30 from a gap between the chassis 11 and the cover 13 and a gap between the cover 13 and the electrode 19, from reaching the insulating substrate 16 and the semiconductor chip 17 disposed below the waterproof water-repellent layer 21, or retards the moisture reaching the insulating substrate 16 and the semiconductor chip 17 disposed below the waterproof water-repellent layer 21.

The second sealing material 22 fills the inner space 11*a* of the exterior 30. The second sealing material 22 is disposed on the waterproof water-repellent layer 21, and disposed on the main surface 12*a* of the heat radiation plate 12 to be overlapped on the insulating substrate 16, the semiconductor chip 17, the first sealing material 20, and the waterproof water-repellent layer 21. The second sealing material 22 is made up of silicone gel.

In the semiconductor device 1, the insulating substrate 16 and the semiconductor chip 17 are covered by the silicone gel which can easily fill the inner space or can be easily housed therein, and can be easily removed and the fluorine-series resin or the silicone-series resin. Thus, failure analysis and recycle of the semiconductor device 1 can be facilitated. A production efficiency of the semiconductor device 1 can be improved.

In the semiconductor device 1, the insulating substrate 16 and the semiconductor chip 17 are sealed by the first sealing material 20 and the second sealing material 22. Thus, the insulating substrate 16 and the semiconductor chip 17 are electrically insulated from each other by the first sealing material 20 and the second sealing material 22. In the semiconductor device 1, a main part of the electrode 19 is sealed by the first sealing material 20 and the second sealing material 22. Thus, the electrodes 19 are electrically insulated from each other by the first sealing material 20 and the second sealing material 22. Thus, the semiconductor device 1 having high insulation properties can be provided. In the semiconductor device 1, the waterproof water-repellent layer 21 suppresses exposure of the insulating substrate 16 and the semiconductor chip 17 to the moisture. Thus, the semiconductor device 1 having high moisture resistance can be provided. In the semiconductor device 1, the second sealing material 22 suppresses a foreign material mixed into the waterproof water-repellent layer 21. Thus, loss of high moisture resistance of the semiconductor device 1 caused by the foreign material mixed into the waterproof water-repellent layer 21 can be suppressed. According to these configurations, the semiconductor device 1 having high insulation properties and having high moisture resistance over a long period of time can be provided.

1.2 Fill Ration of First Sealing Material and Position of Waterproof Water-Repellent Layer The first sealing material 20 preferably fills the inner space 11*a* up to an upper side of a loop top 18*a* located in an uppermost portion of the Al wire 18, and more preferably fills the inner space 11*a* up to an immediately upper side of the loop top 18*a* of the Al wire 18 when seen from the main surface 12*a* of the heat radiation plate 12. The waterproof water-repellent layer 21 is preferably disposed on an upper side of the loop top 18*a* of the Al wire 18, and more preferably disposed on an immediately upper side of the loop top 18*a* of the Al wire 18 when seen from the main surface 12*a* of the heat radiation plate 12.

When the first sealing material 20 only fills the inner space 11*a* halfway between the loop top 18*a* of the Al wire 18 and a junction of the Al wire 18 with the conductor pattern 42 and the waterproof water-repellent layer 21 is disposed halfway between the loop top 18*a* of the Al wire 18 and the junction of the Al wire 18 with the conductor pattern 42, it is difficult to form a flat waterproof water-repellent layer 21, and an effect of the waterproof water-repellent layer 21 preventing ingress of the moisture tends to decrease. Thermal stress acts on the Al wire 18 by the two silicone gel layers made up of the first sealing material 20 and the second sealing material 22, and the Al wire 18 tends to be cut easily. Thus, the first sealing material 20 preferably fills the inner space 11*a* up to the upper side of the loop top 18*a* of the Al wire 18. The waterproof water-repellent layer 21 is preferably disposed on the upper side of the loop top 18*a* of the Al wire 18.

1.3 Hardness of First Sealing Material and Second Sealing Material

The second sealing material 22 preferably has higher hardness than the first sealing material 20. For example, when penetrability of the first sealing material 20 expressing the hardness of the first sealing material 20 is 60 (mm/10), penetrability of the second sealing material 22 expressing the hardness of the second sealing material 22 is set to 40 (mm/10) smaller than that of the first sealing material 20. Hardness of the silicones gel gets larger as penetrability thereof decreases.

Accordingly, even when the semiconductor device 1 is reversed when the semiconductor device 1 is in actual use, the first sealing material 20 and the waterproof water-repellent layer 21 can be held. Accordingly, the insulation properties and the moisture resistance of the semiconductor device 1 can be increased. A tolerated dose of the semiconductor device 1 against a mechanical stress such as oscillation and impact, for example, can be increased.

1.4 Semiconductor Constituting Semiconductor Chip

The semiconductor chip 17 may be a semiconductor chip including a silicon semiconductor, and is preferably a semiconductor chip including a wide bandgap semiconductor. The wide bandgap semiconductor is silicon carbide (SiC), gallium nitride (GaN), and diamond (C), for example. The wide bandgap semiconductor such as silicon carbide (SiC), gallium nitride (GaN), and diamond (C), for example, has a bandgap wider than that of a semiconductor such as silicon (Si), for example. When the semiconductor chip 17 is a semiconductor chip including a wide bandgap semiconductor, an insulation life of the semiconductor chip 17 under a high temperature environment can be stably maintained. When the semiconductor chip 17 is a semiconductor chip including a wide bandgap semiconductor, a space occupied by the semiconductor chip 17 can be reduced, thus downsizing and weight saving of the semiconductor device 1 can be achieved.

2 Embodiment 2

The semiconductor device according to the embodiment 1 described above is applied to a power conversion device, in the present embodiment. Although the application of the semiconductor device according to the embodiment 1 is not limited to a specific power conversion device, described hereinafter as the embodiment 2 is a case of applying the semiconductor device according to the embodiment 1 to a three-phase inverter.

FIG. 2 is a block diagram illustrating a configuration of a power conversion system applying a power conversion device according to the present embodiment.

The power conversion system illustrated in FIG. 2 is made up of a power source 100, a power conversion device 200, and a load 300. The power source 100, which is a direct current power source, supplies a direct current power to the power conversion device 200. The power source 100 can be made up of various types of components such as a direct current system, a solar battery, or a rechargeable battery, or may be also made up of a rectifying circuit connected to an alternating current system or an AC/DC converter, for example. The power source 100 may also be made up of a DC/DC converter which converts a direct current power outputted from the direct current system into a predetermined power.

The power conversion device 200, which is a three-phase inverter connected between the power source 100 and the load 300, converts the direct current power supplied from the power source 100 into the alternating current power to supply the alternating current power to the load 300. As illustrated in FIG. 2, the power conversion device 200 includes a main conversion circuit 201 which converts the direct current power into the alternating current power and a control circuit 203 which outputs control signals for controlling the main conversion circuit 201 to the main conversion circuit 201.

The load 300 is a three-phase electrical motor driven by the alternating current power supplied from the power conversion device 200. The load 300 is not for specific purpose of use but is the electrical motor mounted on various types of electrical devices, thus it is used as the electrical motor for a hybrid car, an electrical car, a rail vehicle, an elevator, or an air-conditioning equipment, for example.

The power conversion device 200 is described in detail hereinafter. The main conversion circuit 201 includes a switching element and a reflux diode (not shown), and when a switching is performed on the switching element, the direct current power supplied from the power source 100 is converted into the alternating current power and then supplied to the load 300. The main conversion circuit 201 includes various types of specific circuit configurations, and the main conversion circuit 201 according to the present embodiment is a three-phase full-bridge circuit having two levels, and can be made up of six switching elements and six reflux diodes being antiparallel to each switching element. Each switching element and each reflux diode of the main conversion circuit 201 are made up of a semiconductor module 202 corresponding to the embodiment 1 described above. The two switching elements among the six switching elements are series-connected to each other to constitute upper and lower arms, and each of the upper and lower arms constitutes each phase (U-phase, V-phase, and W-phase) of the full-bridge circuit. An output terminal of each of the upper and lower arms, that is to say, three output terminals of the main conversion circuit 201 are connected to the load 300.

The main conversion circuit 201 includes a drive circuit (not shown) for driving each switching element, however, the drive circuit may be embedded in the semiconductor module 202 or may also have a configuration including a drive circuit separately from the semiconductor module 202. The drive circuit generates the drive signal for driving the switching element of the main conversion circuit 201, and supplies the drive signal to a control electrode of the switching element of the main conversion circuit 201. Specifically, the drive circuit outputs the drive signals for switching the switching element to an ON state and the drive signals for switching the switching element to an OFF state to the control electrode of each switching element in accordance with the control signals from the control circuit 203 described hereinafter. The drive signal is a voltage signal (ON signal) equal to or higher than a threshold voltage of the switching element when the switching element is kept in the ON state, and the drive signal is a voltage signal (OFF signal) equal to or lower than the threshold voltage of the switching element when the switching element is kept in the OFF state.

The control circuit 203 controls the switching element of the main conversion circuit 201 to supply a desired power to the load 300. Specifically, the control circuit 203 calculates a time when each switching element of the main conversion circuit 201 needs to enter the ON state (ON time), based on the electrical power which needs to be supplied to the load 300. For example, the main conversion circuit 201 can be controlled by performing PWN control for modulating an ON time of the switching element in accordance with the voltage which needs to be outputted. Then, the control circuit 203 outputs a control instruction (control signals) to the drive circuit included in the main conversion circuit 201 so that the drive circuit outputs the ON signals to the switching element which needs to enter the ON state and outputs the OFF signals to the switching element which needs to enter the OFF state at each time. The drive circuit outputs the ON signals or the OFF signals as the drive signals to the control electrode of each switching element in accordance with the control signals.

The semiconductor module according to the embodiment 1 is applied as the switching element and the reflux diode of the main conversion circuit 201 in the power conversion device according to the present embodiment, thus failure analysis and recycle of the power conversion device can be facilitated, a production efficiency of the power conversion device can be improved, and the power conversion device having high insulation properties and having high moisture resistance over a long period of time can be provided.

Although the example of applying the semiconductor device according to the embodiment 1 to the three-phase inverter having the two levels is described in the present embodiment, the application of the semiconductor device according to the embodiment 1 is not limited thereto, but can be applied to the various power conversion devices. Although the power conversion device having the two levels is described in the present embodiment, a power conversion device having three or multiple levels may also applied. The semiconductor device according to the embodiment 1 may be applied to a single-phase inverter when the power is supplied to a single-phase load. The semiconductor device according to the embodiment 1 can be applied to a DC/DC converter or an AC/DC converter when the electrical power is supplied to a direct current load, for example.

The load of the power conversion device applying the semiconductor device according to the embodiment 1 is not limited to the electrical motor as described above, but an electrical discharge machine or a laser beam machine may also be the load. The power conversion device can also be used as a power-supply device of an induction heat cooking device or a non-contact power feeding system, and can also be further used as a power conditioner of a solar power system or an electricity storage system, for example.

3 Embodiment 3

Figure 3:
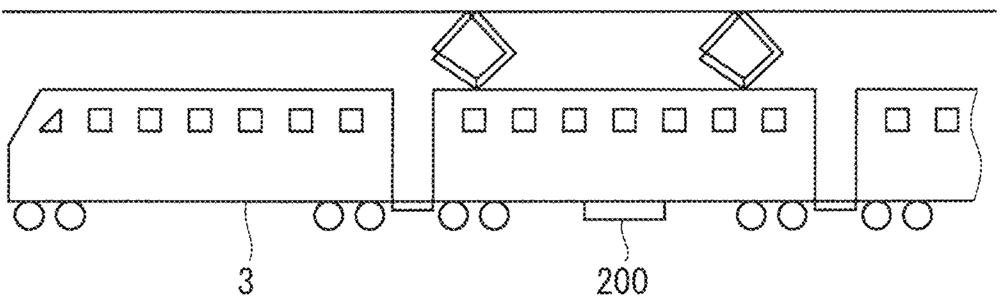
FIG. 3 A side view schematically illustrating a moving body according to an embodiment 3.

FIG. 3 is a side view schematically illustrating a moving body according to an embodiment 3.

A moving body 3 illustrated in FIG. 3 is a train. The moving body 3 may be a moving body other than the train. For example, the moving body 3 may be an automobile, a boat, a ship, an aircraft, a battery-assisted bicycle, or an electrical wheelchair.

The moving body 3 includes the power conversion device 200 according to the embodiment 2. The moving body 3 drives a motor, for example, by an electrical power converted by the power conversion device 200.

When a downsized and light-weighted semiconductor device is applied to the power conversion device 200 according to the embodiment 2, downsizing and weight saving of the moving body 3 can be achieved, efficiency of the moving body 32 can be improved, and performance of the moving body 3 can be improved.

According to the present invention, the above embodiments can be arbitrarily combined, or each embodiment can be appropriately varied or omitted within the scope of the invention.

The present invention has been shown and described in detail, the foregoing description is in all aspects illustrative and not restrictive. It is therefore understood that numerous modifications and variations can be devised without departing from the scope of the invention.

EXPLANATION OF REFERENCE SIGNS

1 semiconductor device, 11 chassis, 11*a* inner space, 11*b* first opening, 11*c* second opening, 12 heat radiation plate, 12*a* main surface, 13 cover, 16 insulating substrate, 17 semiconductor chip, 18 Al wire, 18*a* loop top, 19 electrode, 20 first sealing material, 21 waterproof water-repellent layer, 22 second sealing material, 30 exterior, 30*a* inner surface, 41 insulator plate, 42 conductor pattern, 100 power source, 200 power conversion device, 201 main conversion circuit, 202 semiconductor module, 203 control circuit, 300 load, 3 moving body.

The invention claimed is:

1. A semiconductor device, comprising:

an exterior including an inner space and an inner surface surrounding the inner space;

a semiconductor chip housed in the inner space and mounted on the inner surface;

a first sealing material filling a first portion of the inner space, disposed on the inner surface such that the first sealing material overlaps the semiconductor chip, and made up of silicone gel;

a waterproof water-repellent layer housed in the inner space, disposed on the inner surface and over the first sealing material such that the waterproof water-repellent layer overlaps the semiconductor chip and the first sealing material, and made up of fluorine-series resin or silicone-series resin; and a second sealing material filling a second portion of the inner space, disposed on the inner surface and over the waterproof water-repellent layer such that the second sealing material overlaps the semiconductor chip, the first sealing material, and the waterproof water-repellent layer, and made up of silicone gel, the second sealing material directly contacting the waterproof water-repellent layer, wherein the second sealing material has higher hardness than the first sealing material.

2. The semiconductor device according to claim 1, further comprising a conductor wire housed in the inner space and connected to the semiconductor chip, wherein the first sealing material fills the inner space up to an upper side of an uppermost portion of the conductor wire, and the waterproof water-repellent layer is disposed on the upper side of the uppermost portion of the conductor wire.

3. The semiconductor device according to claim 1, wherein the exterior includes:

a chassis having the inner space and having a first opening and a second opening;

a heat radiation plate bonded to the chassis, covering the first opening, and including a main surface constituting a part of the inner surface; and a cover bonded to the chassis to cover the second opening, and the semiconductor chip is mounted on the main surface.

4. The semiconductor device according to claim 3, further comprising:

an insulating substrate bonded to the main surface and including an insulator plate and a conductor pattern disposed on the insulator plate; and an electrode bonded to the conductor pattern to pass through the cover, wherein the semiconductor chip is mounted on an upper surface of the insulating substrate.

5. The semiconductor device according to claim 1, wherein the semiconductor chip includes a wide bandgap semiconductor.

6. A power conversion device, comprising:

a main conversion circuit including the semiconductor device according to claim 1, and converting and outputting an electrical power inputted to the main conversion circuit; and a control circuit outputting control signals for controlling the main conversion circuit to the main conversion circuit.

7. A moving body comprising the power conversion device according to claim 6.

8. The semiconductor device according to claim 1, wherein the waterproof water-repellent layer is positioned above all semiconductor chips in the inner space.

9. The semiconductor device according to claim 1, wherein the first sealing material is removable.

* * * * *